(12) United States Patent
Zhao et al.

(10) Patent No.: US 11,640,956 B2
(45) Date of Patent: May 2, 2023

(54) MODULE-ROTATION LED DOME

(71) Applicant: Shenzhen Galaxypixel Electronics Co., Ltd, Shenzhen (CN)

(72) Inventors: Ligang Zhao, Huizhou (CN); Guangming Song, Huizhou (CN); Heng Zhan, Huizhou (CN); Youhe Zhang, Huizhou (CN); Lei Liang, Huizhou (CN)

(73) Assignee: SHENZHEN GALAXYPIXEL ELECTRONICS CO., LTD, Shenzhen (CN)

( * ) Notice: Subject to any disclaimer, the term of this patent is extended or adjusted under 35 U.S.C. 154(b) by 148 days.

(21) Appl. No.: 17/103,107

(22) Filed: Nov. 24, 2020

(65) Prior Publication Data

US 2022/0102321 A1    Mar. 31, 2022

(30) Foreign Application Priority Data

Sep. 30, 2020   (CN) .......................... 202022209451.X

(51) Int. Cl.
| | | |
|---|---|---|
| *H01L 29/20* | (2006.01) | |
| *H01L 33/00* | (2010.01) | |
| *H01L 25/075* | (2006.01) | |
| *H01L 23/538* | (2006.01) | |
| *H01L 33/62* | (2010.01) | |

(52) U.S. Cl.
CPC ...... *H01L 25/0753* (2013.01); *H01L 23/5387* (2013.01); *H01L 33/62* (2013.01)

(58) Field of Classification Search
CPC ................. H01L 25/0753; H01L 33/62; H01L 2933/0066; H01L 25/13; G09F 9/302; G09F 9/33
See application file for complete search history.

(56) References Cited

U.S. PATENT DOCUMENTS

| | | | |
|---|---|---|---|
| 2005/0099317 A1* | 5/2005 | Pederson | B60Q 7/00 340/815.45 |
| 2008/0123057 A1* | 5/2008 | Williamson | F21V 7/0091 353/30 |
| 2019/0096292 A1* | 3/2019 | Chang | H01L 33/62 |
| 2020/0219856 A1* | 7/2020 | Chang | H01L 25/0753 |
| 2022/0029060 A1* | 1/2022 | Park | H01L 33/387 |
| 2023/0044657 A1* | 2/2023 | Hochman | H10K 59/353 |
| 2023/0048591 A1* | 2/2023 | Chen | H01L 25/0753 |

\* cited by examiner

*Primary Examiner* — Ismail A Muse
(74) *Attorney, Agent, or Firm* — WPAT, PC

(57) ABSTRACT

A module-rotation LED dome belongs to the technical field of display screens and includes multiple display devices. Each display device includes 1st-4th light-emitting units. The second light-emitting unit is located beside the first light-emitting unit and oriented with a clockwise rotation of 90 degrees relative to the first light-emitting unit. The third light-emitting unit is located below the second light-emitting unit and oriented with a clockwise rotation of 90 degrees relative to the second light-emitting unit. The fourth light-emitting unit is located beside the third light-emitting unit and oriented with a clockwise rotation of 90 degrees relative to the third light-emitting unit. The 2nd-4th light-emitting units sequentially are rotated clockwise with 90 degrees, so that adjacent full-color LEDs in the 1st-4th light-emitting units cannot form adjacent LEDs of a same color, and there is no condition of appearing a bright blue line.

5 Claims, 3 Drawing Sheets

US 11,640,956 B2

MODULE-ROTATION LED DOME

TECHNICAL FIELD

The invention relates to the technical field of display screens, and more particularly to a module-rotation LED dome.

DESCRIPTION OF RELATED ART

A LED (light-emitting diode) dome is a spherical display screen composed of flexible modules and has a display surface facing outward. Companies in the LED display industry select design schemes mainly based on cost. When the cost is sufficient, in order to pursue an excellent display effect, two hemisphere modules will be designed with different LED arrangements, and there is no blue line appeared on the equator, so that the overall display effect is relatively good, but the design cost and workload of on-site installation will be very large. When the cost is relatively insufficient, it will choose to design one hemisphere modules first, and then rotates 180 degrees to get the other hemisphere modules to thereby form a complete spherical display screen, so that the two hemisphere modules can be used in common, which greatly reduces the design cost and installation workload, but there will be a blue line appeared near the equator that will affect the display effect. This is because light-emitting diodes in each LED lamp respectively are red, green and blue arranged in a strip type manner in that order under normal circumstances, and the light-emitting diodes in two adjacent LED lamps will not have LEDs of a same color adjacent to each other. When one hemisphere module is gotten by rotating the other hemisphere module by 180 degrees, the light-emitting diodes respectively in the adjacent lamps on both sides of the equator are blue, and the equator is the place with the largest arc of the whole sphere, which results in a very obvious bright blue line.

SUMMARY

An objective of the invention is to provide a module-rotation LED dome, so as to solve the technical problem of a bright line appeared in the LED spherical display in the prior art.

A module-rotation LED dome according to the embodiment of the invention includes a plurality of (i.e., more than one) display devices. The plurality of display devices are arranged at equal intervals. Each of the plurality of display devices includes a first light-emitting unit, a second light-emitting unit, a third light-emitting unit and a fourth light-emitting unit. The first light-emitting unit, the second light-emitting unit, the third light-emitting unit and the fourth light-emitting unit have the same structure (e.g., including a red LED, a green LED and a blue LED which have a strip type arrangement). The second light-emitting unit is located beside the first light-emitting unit and oriented with a clockwise rotation of 90 degrees relative to the first light-emitting unit. The third light-emitting unit is located below the second light-emitting unit and oriented with a clockwise rotation of 90 degrees relative to the second light-emitting unit. The fourth light-emitting unit is located beside the third light-emitting unit and below the first light-emitting unit, and further oriented with a clockwise rotation of 90 degrees relative to the third light-emitting unit.

In the embodiment, orientations of the first light-emitting unit, the second light-emitting unit, the third light-emitting unit and the fourth light-emitting respectively are pairwise perpendicular in that order. Herein, for each of the 1st-4th light-emitting units, the orientation thereof is perpendicular to an arrangement direction of the red, green and blue LEDs of itself.

Compared with the prior art, beneficial effects of the invention are as follows:

each of the first light-emitting unit, the second light-emitting unit, the third light-emitting unit and the fourth light-emitting unit is composed of a full-color LED lamp, the full-color LED lamp is composed of red, green and blue, i.e., a red LED, a green LED and a blue LED are packaged in one LED lamp, and each of the first light-emitting unit, the second light-emitting unit, the third light-emitting unit and the fourth light-emitting unit is composed of the red LED, the green LED and the blue LED.

The second light-emitting unit, the third light-emitting unit and the fourth light-emitting unit are rotated clockwise with 90 degrees in that order, so that adjacent full-color LEDs in the 1st-4th light-emitting units cannot form adjacent LEDs of a same color, and there is no condition of appearing a bright blue line.

BRIEF DESCRIPTION OF THE DRAWINGS

In order to illustrate technical solutions of the embodiments of the invention and the prior art more clearly, the drawings used in the description of the embodiments and the prior art will be briefly described below. Apparently, the drawings described below are merely some embodiments of the invention, and those skilled in the art can obtain other drawings based on these drawings without creative efforts.

Figure 1:
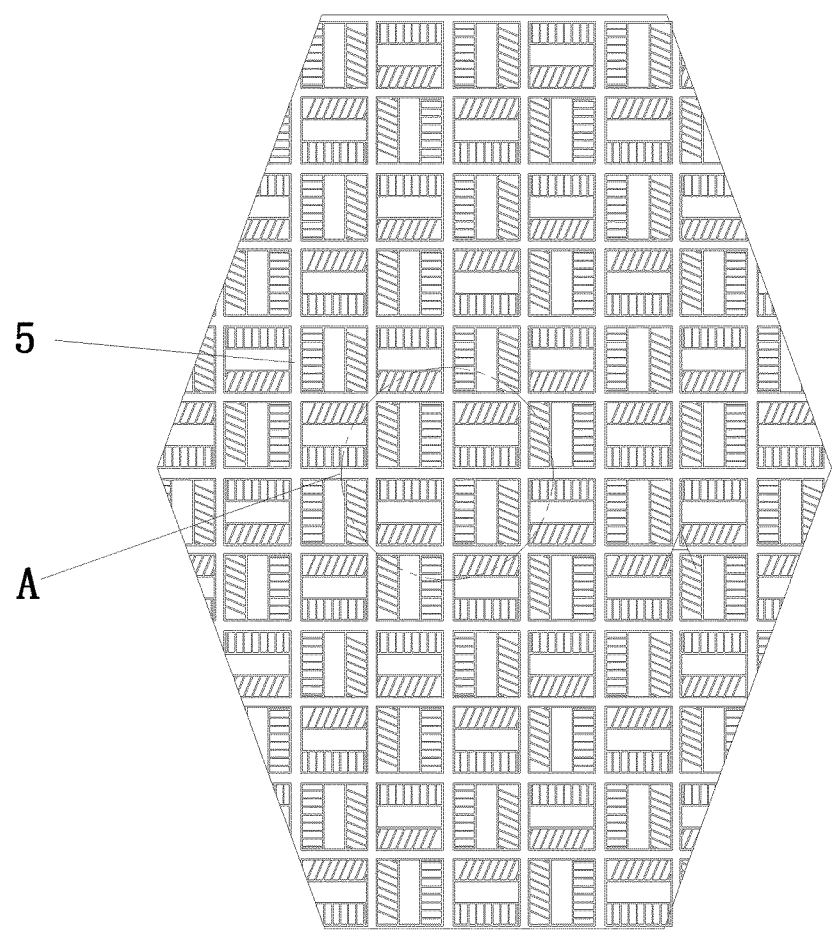
FIG. 1 is a schematic front view of a LED dome of the invention.

Description of numerical references in drawings: the first light-emitting unit 1, the second light-emitting unit 2, the third light-emitting unit 3, the fourth light-emitting unit 4, display device 5.

DETAILED DESCRIPTION OF EMBODIMENTS

The technical solutions in the embodiments of the invention will be clearly and completely described below with reference to the accompanying drawings. Apparently, the described embodiments are merely some of the embodiments of the invention, not all embodiments.

Generally, components of the embodiments of the invention described and shown in the accompanying drawings herein can be arranged and designed in various configurations. Therefore, the following detailed description of the embodiments of the invention provided in the accompanying drawings is not intended to limit the scope of the invention to be protected, but merely illustrates the selected embodiments of the invention.

Based on the described embodiments of the invention, all other embodiments obtained by those skilled in the art without any creativity should belong to the protective scope of the invention.

It is noted that, in the description of the invention, orientations or positional relationships indicated by terms such as "central", "top", "down", "left", "right", "vertical", "horizontal", "inner", "outer", etc. are based on orientations or positional relationships shown in the drawings, and are merely for the convenience of describing the invention and simplifying the description, rather than indicating or implying that the device or element referred to, must have a specific orientation, be constructed and operated in a specific orientation, and therefore cannot be understood as a limitation to the invention. Moreover, terms such as "first", "second", "third", "fourth" are merely for the purpose of illustration and cannot be understood as indicating or implying relative importance.

It is noted that, in the description of the invention, unless otherwise clearly stated and limited, terms "mounted", "connected with" and "connected to" should be understood broadly. For instance, it can be a fixed connection, a detachable connection or an integral connection; can be a mechanical connection, can also be an electrical connection; can be a direct connection, can also be an indirect connection by an intermediary, or can be an internal communication of two elements. A person skilled in the art can understand concrete meanings of the terms in the invention as per specific circumstances.

Figure 2:
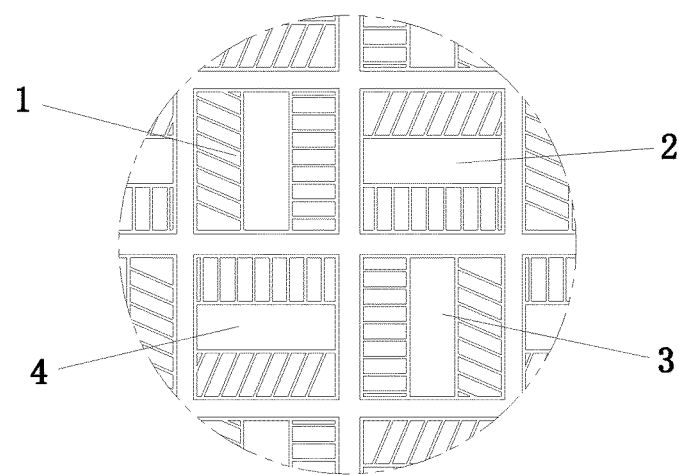
FIG. 2 is a schematic enlarged view of the portion A in FIG. 1.

Referring to FIG. 1 and FIG. 2, an embodiment of the invention provides a module-rotation LED dome including a plurality of display devices 5. The plurality of display devices 5 are arranged at equal intervals. Each of the display devices 5 includes the first light-emitting unit 1, the second light-emitting unit 2, the third light-emitting unit 3 and the fourth light-emitting unit 4. The first light-emitting unit 1, the second light-emitting unit 2, the third light-emitting unit 3 and the fourth light-emitting unit 4 have a same structure. The second light-emitting unit 2 is located beside the first light-emitting unit 1 and oriented with a clockwise rotation of 90 degrees relative to the first light-emitting unit 1. The third light-emitting unit 3 is located below the second light-emitting unit 2 and oriented with a clockwise rotation of 90 degrees relative to the second light-emitting unit 2. The fourth light-emitting unit 4 is located beside the third light-emitting unit 3 and below the first light-emitting unit 1 and further oriented with a clockwise rotation of 90 degrees relative to the third light-emitting unit 3.

Specifically, orientations of the first light-emitting unit 1, the second light-emitting unit 2, the third light-emitting unit 3 and the fourth light-emitting 4 are pairwise perpendicular in that order. In addition, as illustrated in FIG. 2, for each of the first light-emitting unit 1, the second light-emitting unit 2, the third light-emitting unit 3 and the fourth light-emitting 4, the orientation thereof is perpendicular to an arrangement direction of red, green and blue LEDs of itself.

Figure 3:
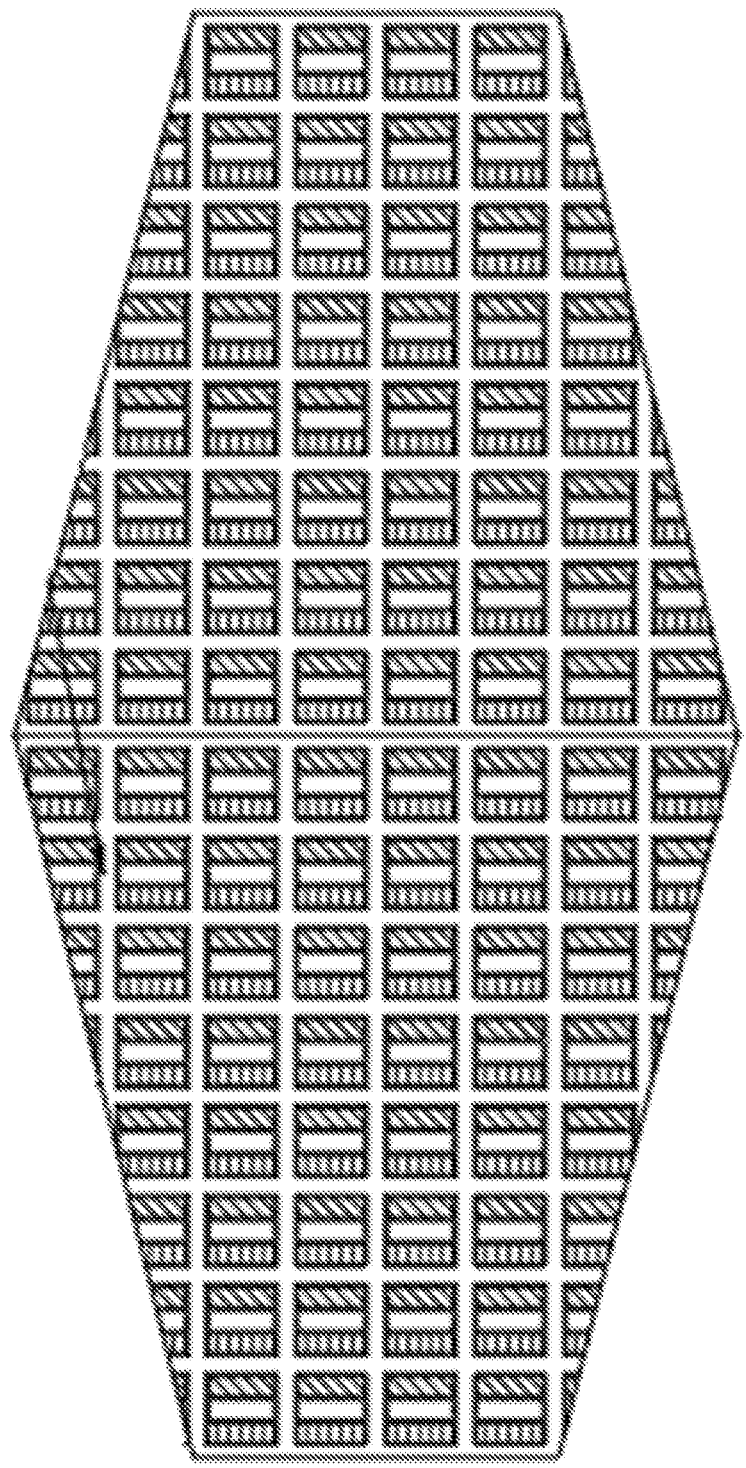
FIG. 3 is a schematic front view of a first conventional modular LED dome.
Figure 4:
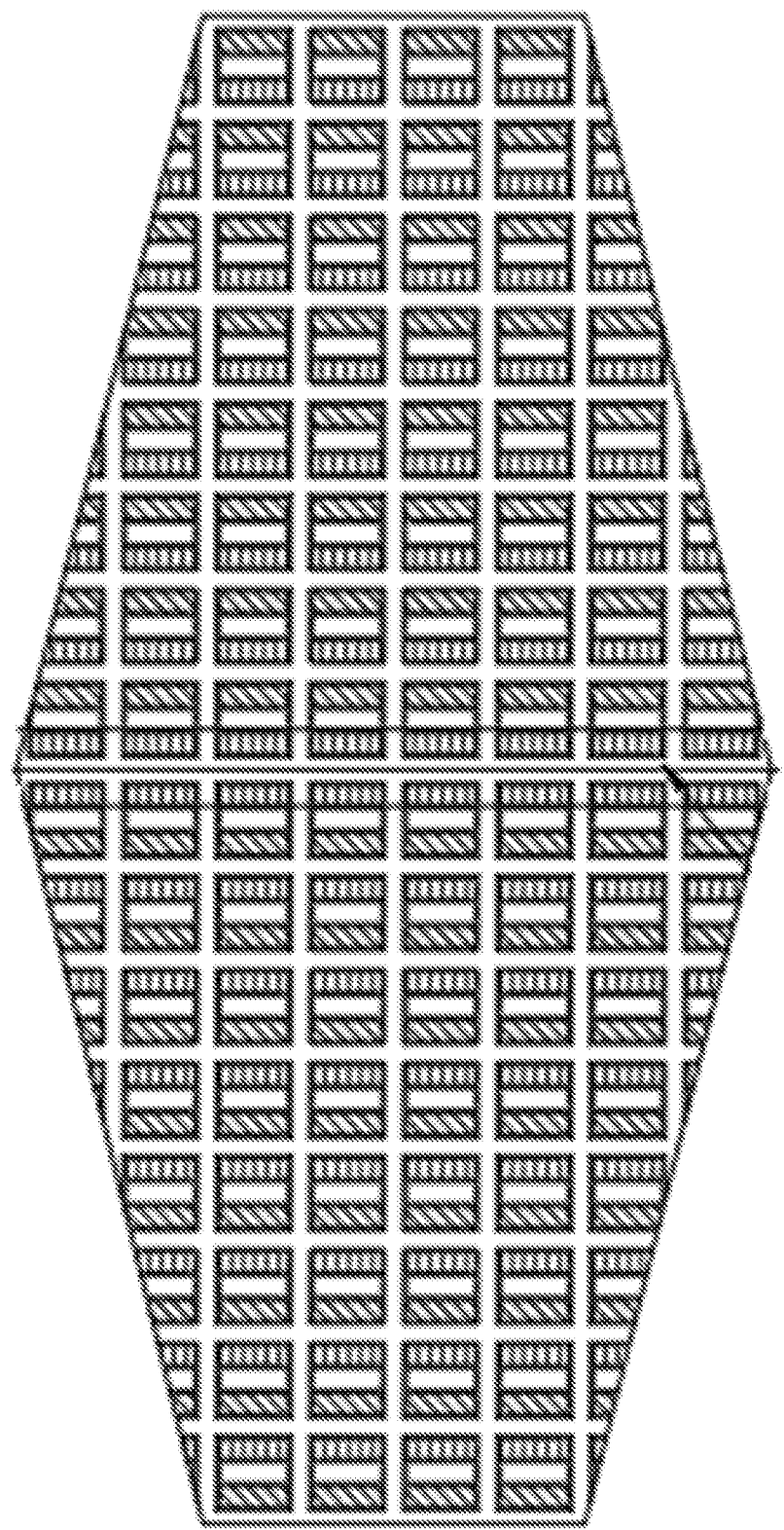
FIG. 4 is a schematic front view of a second conventional modular LED dome.

As shown in FIG. 3 and FIG. 4, each the LED dome is a spherical display screen composed of flexible modules and has a display surface facing outward. At present, there are two conventional design schemes as follows:

The first is to design two hemisphere modules with different LED arrangements, so that the display effect is better, but the amount of design work is too large; and the second is to design two hemisphere modules with the same LED arrangement, the amount of design work will be reduced by half, but there will be an obvious blue line appeared on the equator, which will affect the display effect.

The invention integrates the advantages of the above two conventional design schemes, which reduces the amount of design without affecting the display effect.

Finally, it should be noted that the above embodiments are only used to illustrate the technical solutions of the invention, rather than limit the invention. Although the invention has been described in detail with reference to the above-mentioned embodiments, those skilled in the art should understand that it is still possible to modify the technical solutions illustrated in the above-mentioned embodiments, or equivalently replace some or all of the technical features; these modifications or replacements do not cause the essence of the corresponding technical solutions to deviate from the scope of the technical solutions of the embodiments of the invention.

What is claimed is:

1. A module-rotation light-emitting diode (LED) dome, comprising a plurality of display devices;
    wherein the plurality of display devices are arranged at equal intervals;
    wherein each of the plurality of display devices comprises a first light-emitting unit, a second light-emitting unit, a third light-emitting unit and a fourth light-emitting unit;
    wherein the first light-emitting unit, the second light-emitting unit, the third light-emitting unit and the fourth light-emitting unit have the same structure;
    wherein the second light-emitting unit is located beside the first light-emitting unit and oriented with a clockwise rotation of 90 degrees relative to the first light-emitting unit;
    wherein the third light-emitting unit is located below the second light-emitting unit and oriented with a clockwise rotation of 90 degrees relative to the second light-emitting unit;
    wherein the fourth light-emitting unit is located beside the third light-emitting unit and below the first light-emitting unit, and further oriented with a clockwise rotation of 90 degrees relative to the third light-emitting unit;
    wherein the module-rotation LED dome is a spherical display screen and has a display surface facing outward;
    wherein each of the first light-emitting unit, the second light-emitting unit, the third light-emitting unit and the fourth light-emitting unit consists of a red LED, a green LED and a blue LED which are packaged in one LED lamp; and the first light-emitting unit, the second light-emitting unit, the third light-emitting unit and the fourth light-emitting unit are individually packaged; and
    wherein the red LED, the green LED and the blue LED are arranged in a strip manner, and an orientation of each of the first light-emitting unit, the second light-emitting unit, the third light-emitting unit and the fourth light-emitting unit is perpendicular to an arrangement direction of the red LED, the green LED and the blue LED thereof.

2. The module-rotation LED dome as claimed in claim 1, wherein orientations of the first light-emitting unit, the second light-emitting unit, the third light-emitting unit and the fourth light-emitting respectively are pairwise perpendicular in that order.

3. The module-rotation LED dome as claimed in claim 1, wherein in adjacent two of the first through fourth light-emitting units, an arrangement direction of the red LED, the green LED and the blue LED in one of the adjacent two of the first through fourth light-emitting units is perpendicular to that of the other of the adjacent two of the first through fourth light-emitting units.

4. A module-rotation LED dome, comprising a plurality of display devices;
    wherein the plurality of display devices are arranged at equal intervals;

wherein each of the plurality of display devices comprises a first light-emitting unit, a second light-emitting unit, a third light-emitting unit and a fourth light-emitting unit;

wherein the first light-emitting unit, the second light-emitting unit, the third light-emitting unit and the fourth light-emitting unit have the same structure;

wherein the second light-emitting unit is located beside the first light-emitting unit and oriented with a clockwise rotation of 90 degrees relative to the first light-emitting unit;

wherein the third light-emitting unit is located below the second light-emitting unit and oriented with a clockwise rotation of 90 degrees relative to the second light-emitting unit;

wherein the fourth light-emitting unit is located beside the third light-emitting unit and below the first light-emitting unit, and further oriented with a clockwise rotation of 90 degrees relative to the third light-emitting unit;

wherein each of the first light-emitting unit, the second light-emitting unit, the third light-emitting unit and the fourth light-emitting unit consists of one red LED, one green LED and one blue LED which are packaged in one LED lamp; and wherein the red LED, the green LED and the blue LED are juxtaposedly arranged, and an orientation of each of the first light-emitting unit, the second light-emitting unit, the third light-emitting unit and the fourth light-emitting unit is perpendicular to an arrangement direction of the red LED, the green LED and the blue LED thereof.

5. The module-rotation LED dome as claimed in claim 4, wherein in adjacent two of the first through fourth light-emitting units, an arrangement direction of the red LED, the green LED and the blue LED in one of the adjacent two of the first through fourth light-emitting units is perpendicular to that of the other of the adjacent two of the first through fourth light-emitting units.

* * * * *